(12) United States Patent
Matsumoto et al.

(10) Patent No.: US 9,099,285 B2
(45) Date of Patent: Aug. 4, 2015

(54) PLASMA PROCESSING METHOD AND PLASMA PROCESSING APPARATUS

(71) Applicant: TOKYO ELECTRON LIMITED, Tokyo (JP)

(72) Inventors: Hiroie Matsumoto, Albany, NY (US); Kazuto Ogawa, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/064,293

(22) Filed: Oct. 28, 2013

(65) Prior Publication Data

US 2014/0120732 A1    May 1, 2014

Related U.S. Application Data

(60) Provisional application No. 61/722,834, filed on Nov. 6, 2012.

(30) Foreign Application Priority Data

Oct. 29, 2012    (JP) .................................. 2012-238072

(51) Int. Cl.
   *H01L 21/302*    (2006.01)
   *H01J 37/32*    (2006.01)
   (Continued)

(52) U.S. Cl.
   CPC ....... *H01J 37/3244* (2013.01); *H01J 37/32091* (2013.01); *H01L 21/3065* (2013.01); *H01L 21/31116* (2013.01); *H01L 21/31144* (2013.01); *H01L 21/76802* (2013.01); *H01L 21/76816* (2013.01); *H01L 21/8221* (2013.01); *H01L 27/11556* (2013.01)

(58) Field of Classification Search
   CPC ................... H01L 21/31116; H01L 21/76802; H01L 21/8221; H01L 27/0688; H01L 27/11551; H01L 27/11578; H01L 21/3065; H01L 2924/01074; B81C 2201/014
   See application file for complete search history.

(56) References Cited

U.S. PATENT DOCUMENTS

5,451,543 A * 9/1995 Woo et al. ..................... 438/637

FOREIGN PATENT DOCUMENTS

| JP | 2005-26659 A | 1/2005 |
|---|---|---|
| JP | 2009-170661 A | 7/2009 |

OTHER PUBLICATIONS

S. Wolf and R.N. Tauber, Silicon Processing for the VLSI Era, vol. 1, Lattice Press, ISBN 0-9616721-6-1, year 2000, pp. 672-683, and 698-710.*

*Primary Examiner* — Lan Vinh
*Assistant Examiner* — Jiong-Ping Lu
(74) *Attorney, Agent, or Firm* — Rothwell, Figg, Ernst & Manbeck, P.C.

(57) ABSTRACT

Provided are a plasma processing method and a plasma processing apparatus which may form a protective film on the surface of an etching stop layer and suppress clogging of openings of holes when etching an oxide layer are provided. The plasma processing method forms a plurality of holes having different depths in multi-layered films that include an oxide layer, a plurality of etching stop layers made of tungsten, and a mask layer. The plasma processing method includes an etching process in which a processing gas is supplied to generate plasma such that etching is performed from the top surface of the oxide layer to the plurality of etching stop layers so as to form hole having different depths in the oxide layer. Here, the processing gas includes a fluorocarbon-based gas, a rare gas, oxygen, and nitrogen.

5 Claims, 10 Drawing Sheets

(51) Int. Cl.
*H01L 21/3065* (2006.01)
*H01L 21/822* (2006.01)
*H01L 21/768* (2006.01)
*H01L 21/311* (2006.01)
*H01L 27/115* (2006.01)

FIG.5

| | TARGET | COMPARATIVE EXAMPLE | | | EXAMPLE | | | | | |
|---|---|---|---|---|---|---|---|---|---|---|
| N₂ (sccm) | | 0 | | | 50 | | | 100 | | |
| O₂ (sccm) | | 65 | 60 | 60 | 55 | 50 | 60 | 55 | 50 | 45 |
| No. | | 1 | 2 | 1 | 2 | 3 | 4 | 5 | 6 | 7 |
| ACL Rem. / Sel. [nm] | >430nm / >4.0 | 412 / 4.1 | / | 429 / 4.2 | 432 / 4.0 | / | 254 / 3.5 | 351 / 3.8 | 446 / 4.1 | / |
| Depth [nm] | 3000 ~3200 | 3306 | / | 3288 | 3184 | / | 3385 | 3290 | 3151 | / |
| Top CD [nm] | — | 125 | / | 117 | 107 | / | 161 | 130 | 110 | / |
| Bow CD [nm] | — | 176 | / | 145 | 139 | / | 167 | 152 | 137 | / |
| Δ(Bow-Top) [nm] | <50 | 51 | / | 28 | 32 | / | 6 | 22 | 27 | / |
| W loss / Sel. [nm] | Sel. >250 | 9.1 / 205 | 7 / 132 | 5.5 / 333 | 4.5 / 383 | 0~1 / 132 | 8.7 / 223 | 7.7 / 239 | 3.0 / 575 | / |
| Clogging | Free | Free | | Free | Free | | Free | Free | Free | Free |

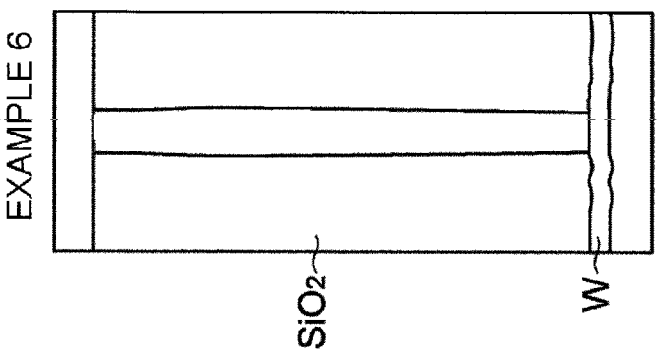
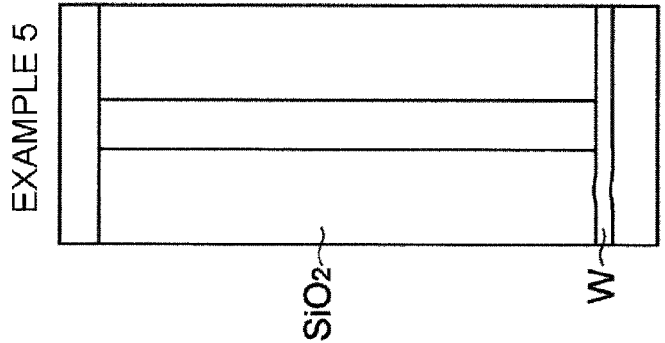
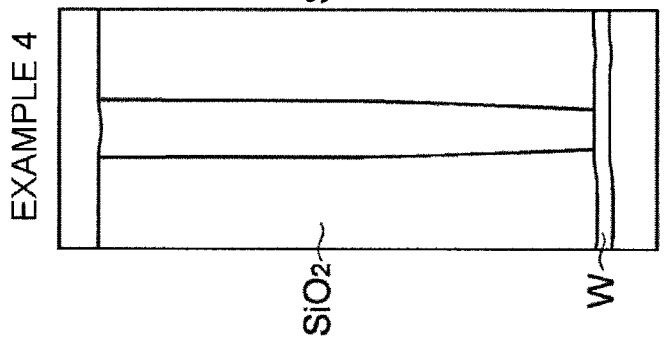
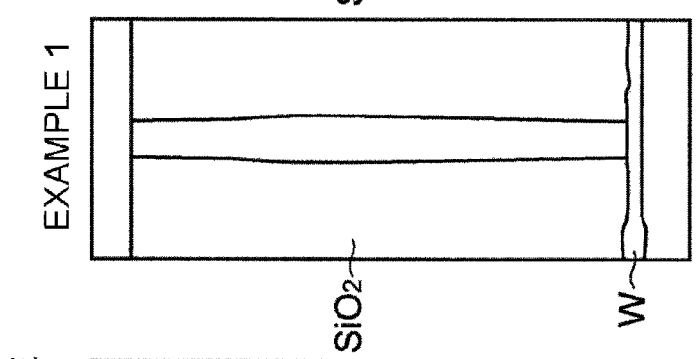
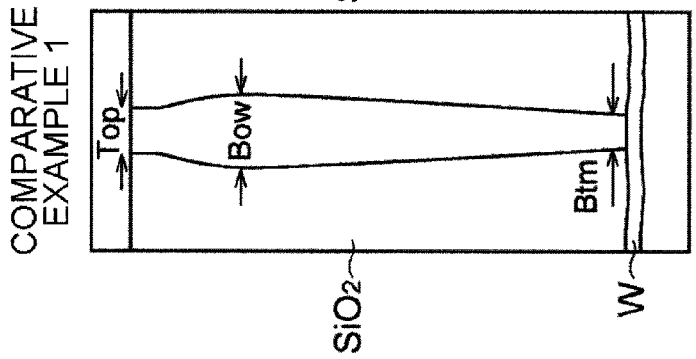

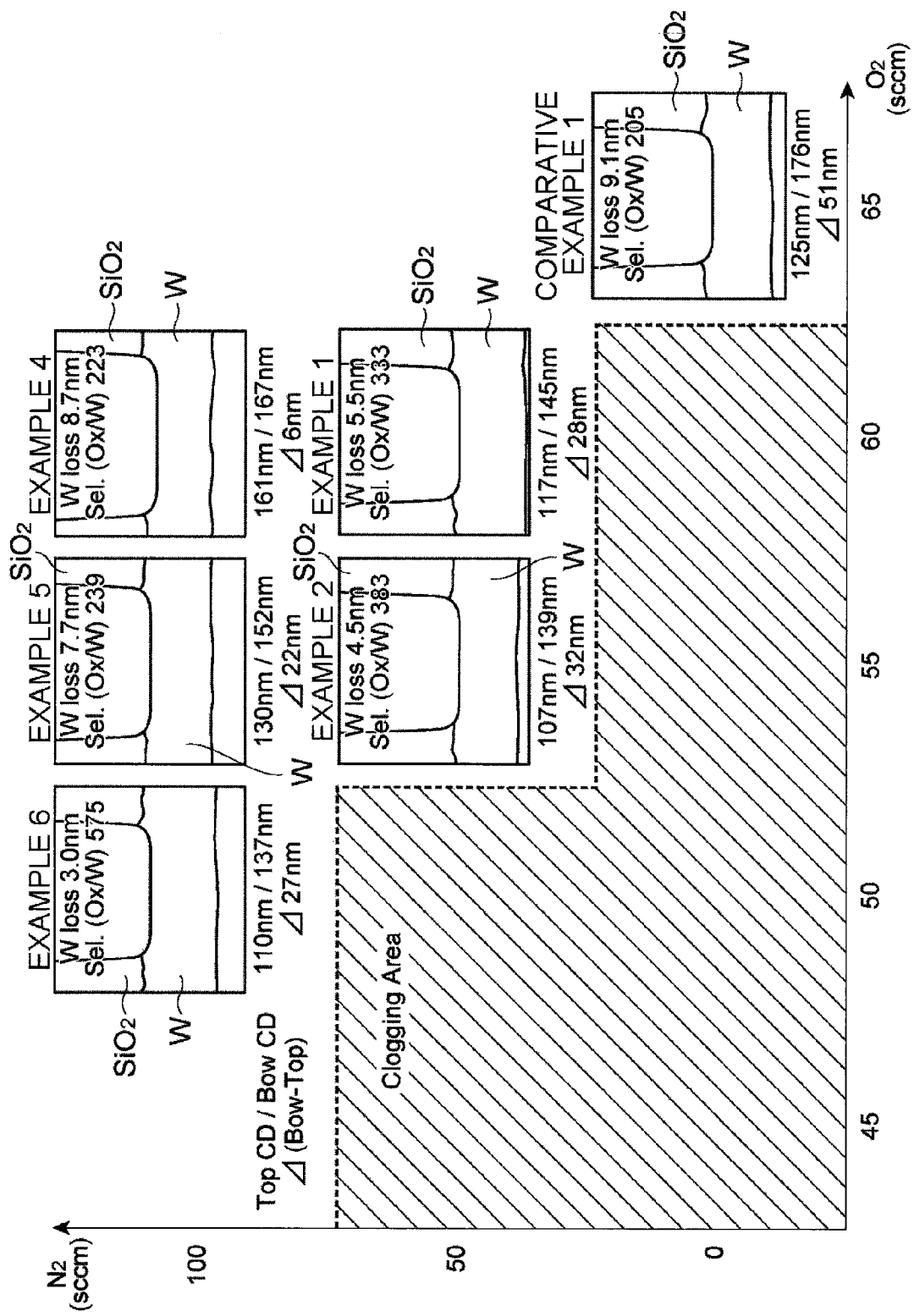

US 9,099,285 B2

PLASMA PROCESSING METHOD AND PLASMA PROCESSING APPARATUS

CROSS-REFERENCE TO RELATED APPLICATIONS

This application is based on and claims priority from Japanese Patent Application No. 2012-238072 filed on Oct. 29, 2012 with the Japan Patent Office, and U.S. Provisional Patent Application No. 61/722,834, filed on Nov. 6, 2012 with the USPTO, the disclosures of which are incorporated herein in their entireties by reference.

TECHNICAL FIELD

The present disclosure relates to a plasma processing method and plasma processing apparatus.

BACKGROUND

A method of etching a multilayer film having an oxide layer is known as a conventional plasma processing method. See, for example, Japanese Patent Laid-Open Publication No. 2005-26659. The method disclosed in Japanese Patent Laid-Open Publication No. 2005-26659 is a manufacturing process of a NAND type flash memory and uses a tungsten thin film as a hard mask for etching an oxide layer. The thickness of the tungsten thin film is in the range of about 500 Å to 1000 Å such that the tungsten film may sufficiently endure as an etching barrier during the subsequent etching of the oxide layer is etched.

Also, Japanese Patent Laid-Open Publication No. 2009-170661 discloses an example of a NAND type flash memory. This NAND type flash memory has a three-dimensional structure in which memory cells are stacked in the vertical direction in relation to the surface of a semiconductor substrate. This memory has multi-layered wiring layers in which a plurality of conductive films and a plurality of insulation films are alternately stacked and contacts configured to supply potentials of word lines. In order to form the contacts, a plurality of end portions of the multi-layered wiring layers are worked in a step shape. That is, the lengths of the multi-layered wiring layers are set in such a manner that the lowermost wiring layer has the longest length and the uppermost wiring layer has the shortest length and thus, the lengths of the multi-layered wiring layers get shorter from the lowermost wiring layer towards the uppermost wiring layer.

SUMMARY

A plasma processing method according to the present disclosure forms a plurality of holes having different depths on multi-layered films using a plasma processing apparatus including a processing container which defines a processing space and a gas supply unit configured to supply a processing gas into the processing space. The multilayer film includes an oxide layer and a plurality of etching stop layers. The plurality of etching stop layers are made of tungsten and disposed below the top surface of the oxide layer as well as at different positions in a laminating direction. The plasma processing method includes an etching process in which the processing gas is supplied to generate plasma, and etching is performed from the top surface of the oxide layer up to the plurality of etching stop layers so as to simultaneously form a plurality of holes having different depths in the oxide layer. The processing gas includes a fluorocarbon-based gas, a rare gas, oxygen, and nitrogen.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 5 is a table representing evaluation results of hole shapes, etching resistance of etching stop layers, and clogging with regard to Examples and Comparative Examples.

FIGS. 6A to 6E are views schematically illustrating the hole shapes of Examples and Comparative Examples.

FIG. 7 is a graph representing evaluation results of the etching resistance of the etching stop layers in Examples and Comparative Examples as a relationship between oxygen and nitrogen.

DETAILED DESCRIPTION

Figure 1:
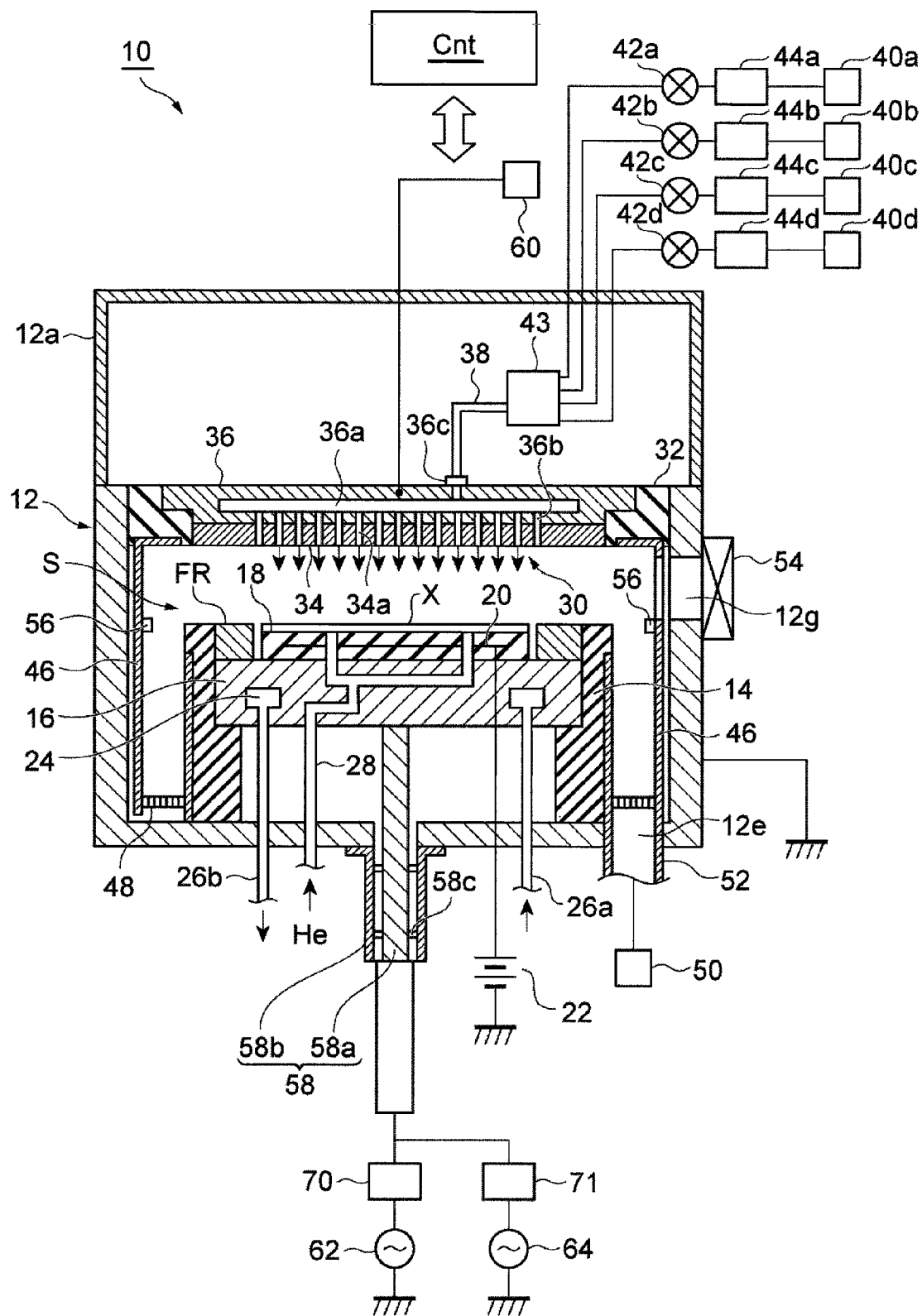
FIG. 1 is a view schematically illustrating a plasma processing apparatus according to an exemplary embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

In order to form the plurality of contacts disclosed in Japanese Patent Laid-Open Publication No. 2009-170661, it is required to form a plurality of holes having different depths. As for a method for forming the plurality of holes, for example, the method disclosed in Japanese Patent Laid-Open Publication No. 2005-26659 may be considered in which a tungsten layer is disposed on each of the multi-layered wiring layers and an oxide layer formed on the tungsten layer is etched using the tungsten layer as an etching stop layer. By this method, holes having different depths may be formed simultaneously.

In the method as described above, when the holes are etched simultaneously, the holes are sequentially reached to the etching stop layers from the shallowest hole because the etching stop layers are disposed at the different positions in the laminating direction. Therefore, the etching stop layer positioned at the bottom of a shallow hole is required to withstand etching until the formation of deeper holes is completed.

However, when over-etching of etching stop layers is avoided by adjusting the thicknesses of the etching stop layers as in the plasma processing method disclosed in Japanese Patent Laid-Open Publication No. 2005-26659, it is required to increase the thicknesses of the etching stop layers according to the depth difference of the holes to be formed. As a result, miniaturization of a device may be hindered. Also, since the differences in depth of formable holes are determined according to the thicknesses of the etching stop layers, a plurality of desired holes may not be formed.

Therefore, what may be considered is optimizing a processing gas to realize a high selection ratio of the etching stop layers made of tungsten and the oxide layers. For example, using a fluorocarbon-based gas may be considered as for a processing gas used in the oxide layer etching process. The fluorocarbon-based gas forms a CF-based protective film on the surface of tungsten while generating CF-based radicals which contribute to etching of the oxide layers, which results in an excellent selection ratio. Meanwhile, since CF radicals among CF-based radicals may become precursors of reaction products which are attached to openings of the holes, the reaction products may be attached to the openings of the holes, thereby causing clogging (blocking of the openings). Thus, using a processing gas containing oxygen may be considered so as to remove the reaction products attached to the openings of the holes. However, since oxygen is gas which has an etching characteristic, it removes the protective films formed on the etching stop layers. Consequently, the selection ratio of the etching stop layers and the oxide layers may be reduced.

Therefore, what is desired are a plasma processing method and a plasma processing apparatus which are capable of forming protective films on the surfaces of etching stop layers and suppressing clogging of the openings of holes when etching oxide layer.

The inventor the found out that, when nitrogen is used, oxygen supply amount may be suppressed because the nitrogen affects the production ratio of $CF$, $CF_2$, and $CF_3$ radicals generated from the fluorocarbon-based gas, which has led to the present disclosure.

A plasma processing method according to the present disclosure forms a plurality of holes having different depths on multi-layered films using a plasma processing apparatus including a processing container which defines a processing space and a gas supply unit configured to supply a processing gas into the processing space. The multilayer film includes an oxide layer and a plurality of etching stop layers. The plurality of etching stop layers are made of tungsten and disposed below the top surface of the oxide layer as well as at different positions in the laminating direction. The plasma processing method includes an etching process in which the processing gas is supplied to generate plasma, and etching is performed from the top surface of the oxide layer up to the plurality of etching stop layers so as to simultaneously form a plurality of holes having different depths in the oxide layer. The processing gas includes a fluorocarbon-based gas, a rare gas, oxygen, and nitrogen.

In the method as described above, the processing gas for etching the oxide layer includes a fluorocarbon-based gas, a rare gas, oxygen and nitrogen. When nitrogen is added, CF and $CF_3$ radicals among $CF$, $CF_2$, and $CF_3$ radicals generated from the fluorocarbon-based gas are reduced. When the CF radicals which are precursors of reaction products attached to the openings of the holes are reduced, the flow rate of oxygen for removing the reaction product may be reduced while suppressing the clogging of the openings of the holes. When the flow rate of oxygen is reduced, that the etching of the protective films formed on the etching stop layers may be avoided. Therefore, the protective films may be formed on the surfaces of the etching stop layers while suppressing the clogging of the openings of the holes when the oxide layer is etched.

In an exemplary embodiment, flow rates of the oxygen and the nitrogen may be set in such a manner that the plurality of etching stop layers except the etching layer which forms the bottom of the deepest hole are suppressed from being etched and the openings of the plurality of holes are suppressed from being clogged until the etching is performed from the top surface of the oxide layer to the surface of the etching stop layer which forms the bottom of the deepest hole. When the flow rates of oxygen and nitrogen are set in terms of suppressing the etching of the etching stop layers as described above, holes having different depths may be simultaneously formed.

In an exemplary embodiment, when the flow rate of oxygen is set as X (X>0) and the flow rate of nitrogen is set as Y (Y>0), X and Y may satisfy Y=−5X+b (300 sccm<b<375 sccm). In an exemplary embodiment, the numerical value b may satisfy 325 sccm≤b≤350 sccm and the flow rate of nitrogen Y may be in the range of 50 sccm≤Y≤100 sccm. When the flow rates of oxygen and nitrogen are set to be in the range of satisfying the equation, a high selection ratio of the etching stop layers and the oxide layer may be realized and holes having excellent shapes may be formed.

In an exemplary embodiment, in a multilayer film, a plurality of etching stop layers may be disposed such that the depth of the deepest hole is twice or more than the shallowest hole. That is, when a NAND type flash memory having a three-dimensional structure is manufactured, a high selection ratio of the etching stop layers and the oxide layer may be realized and holes having excellent shapes may be formed.

A plasma processing apparatus according to another aspect of the present disclosure forms a plurality of holes having different depths on a multilayer film. The multilayer film has an oxide layer and a plurality of etching stop layers. The plurality of etching stop layers are made of tungsten and disposed below the top surface of the oxide layer in a laminating direction as well as at different positions in the laminating direction. The plasma processing apparatus includes a processing container, a mounting table, an upper electrode, a high frequency power supply, a gas supply system, and a control unit. The mounting table has a lower electrode and is disposed within the processing container. The upper electrode is disposed to be opposite to the lower electrode. The high frequency power supply applies high frequency power for exciting plasma to the lower electrode. The gas supply system supplies a processing gas that includes a fluorocarbon-based gas, a rare gas, oxygen, and nitrogen into the processing container. The control unit controls the gas supply system. The control unit causes the gas supply system to supply the processing gas to the processing container to generate plasma such that etching is performed from the top surface of the oxide layer to the plurality of etching stop layers so as to simultaneously form the plurality of holes having different depths on the oxide layer.

In the plasma processing apparatus, the processing gas for etching the oxide layer includes a fluorocarbon-based gas, a rare gas, oxygen, and nitrogen. When nitrogen is added, CF radicals and $CF_3$ radicals are reduced among $CF$, $CF_2$, and $CF_3$ radicals which are generated from fluorocarbon-based gas. When the CF radicals which are precursors of reaction products attached to the openings of the holes are reduced, clogging of the openings of the holes may be suppressed and the flow rate of oxygen for removing the reaction products may be reduced. When the flow rate of oxygen is reduced, excessive etching of the protective films formed on the etching stop layers made of tungsten may be avoided. Therefore, when the oxide layer is etched, the protective films may be formed on the surfaces of the etching stop layers and the clogging of the openings of the holes may be suppressed.

As described above, a plasma processing method and a plasma processing apparatus which may form protective films on the surfaces of etching stop layers and suppress clogging of openings of holes when an oxide layer is etched are provided.

Hereinafter, various exemplary embodiments will be described in detail with reference to the accompanying drawings. The same symbols will be assigned for the same or equivalent elements in the respective drawings.

FIG. 1 is a view illustrating a plasma processing apparatus according to an exemplary embodiment. The plasma processing apparatus 10 illustrated in FIG. 1 is a capacity coupling type parallel flat plate plasma etching apparatus and is provided with a processing container 12 which has a substantially cylindrical shape. For example, the surface of the processing container 12 is formed of anodized aluminum. This processing container 12 is protectively grounded.

A cylindrical support unit 14 formed of an insulation material is disposed on the bottom portion of the processing container 12. This support unit 14 supports a base 16 formed of a metal such as, for example, aluminum. The base 16 is provided within the processing container 12 and constitutes a lower electrode in an exemplary embodiment.

An electrostatic chuck 18 is provided on the top surface of the base 16. The electrostatic chuck 18 constitutes a mounting table of the exemplary embodiment together with the base 16. The electrostatic chuck 18 has a structure in which an electrode 20 which is a conductive film is interposed between a pair of insulation layers or between a pair of insulation sheets. A direct current power supply 22 is electrically connected to the electrode 20. The electrostatic chuck 18 may adsorb and maintain an object to be processed ("workpiece") W by electrostatic force such as, for example, Coulomb force generated by a direct current voltage from the direct current power supply 22.

A focus ring FR is disposed on the top surface of the base 16 around the electrostatic chuck 18. The focus ring FR is provided in order to improve uniformity of etching. The focus ring is formed of a material which is properly selected according to a material of a layer to be etched and may be formed of, for example, silicon or quartz.

A refrigerant chamber 24 is provided inside the base 16. The refrigerant chamber 24 is supplied with a refrigerant of a predetermined temperature, for example, cooling water, by circulating the refrigerant via pipes 26a, 26b from a chiller unit provided outside. When the temperature of the circulated refrigerant is controlled as described above, the temperature of the workpiece W mounted on the electrostatic chuck 18 is controlled.

Also, the plasma processing apparatus 10 is provided with a gas supply line 28. The gas supply line 28 supplies a heat transferring gas from a heat transferring gas supply mechanism, for example, He gas between the top surface of the electrostatic chuck 18 and the rear side of the workpiece W.

Further, an upper electrode 30 is provided inside the processing container 12. The upper electrode 30 is located above the base 16 which is the lower electrode to be opposite to the base 16 and the base 16 and the upper electrode 30 are provided substantially in parallel to each other. A processing space S for plasma etching the workpiece W is defined between the upper electrode 30 and the base (lower electrode) 16.

The upper electrode 30 is supported via an insulation shielding member 32 at the upper portion of the processing container 12. The upper electrode 30 may include an electrode plate 34 and an electrode support 36. The electrode plate 34 faces the processing space S and defines a plurality of gas ejection holes 34a. This electrode plate 34 may be configured by a low-resistance conductor or a semiconductor which has small Joule heat.

The electrode support 36 detachably supports the electrode plate 34 and may be formed of a conductive material such as, for example, aluminum. The electrode support 36 may have a water-cooled structure. A gas diffusion chamber 36a is provided inside the electrode support 36. A plurality of gas communication holes 36b that communicate with the gas ejection holes 34a extend downwards from the gas diffusion chamber 36a. Also, the electrode support 36 is formed with a gas inlet 36c configured to introduce the processing gas to the gas diffusion chamber 36a and a gas supply pipe 38 is connected to the gas inlet 36c.

Gas sources 40a to 40d are connected to the gas supply pipe 38 via a splitter 43, valves 42a to 42d, and mass flow controllers ("MFC") 44a to 44d. Meanwhile, a flow control system ("FCS") may be provided, instead of MFC. The gas source 40a is a gas source of a processing gas that includes a fluorocarbon-based gas ($C_xF_y$) such as, for example, $C_4F_6$ and $C_4F_8$ gases. The gas source 40b is a gas source of a processing gas that includes a rare gas such as, for example, Ar gas. The gas source 40c is a gas source of a processing gas that includes, for example, oxygen. The gas source 40d is a gas source of a processing gas that includes, for example, nitrogen. Upon reaching the gas diffusion chamber 36a from the gas supply pipe 38, the processing gases from the gas sources 40a to 40d are ejected to the processing space S via the gas communication holes 36b and the gas ejection holes 34a. The gas sources 40a to 40d, the valves 42a to 42d, the MFC 44a to 44d, the splitter 43, the gas supply pipe 38, and the upper electrode 30 which defines the gas diffusion chamber 36a, the gas communication holes 36b and gas ejection holes 34a constitute a gas supply unit in the exemplary embodiment.

Also, the plasma processing apparatus 10 may be further provided with a ground conductor 12a. The ground conductor 12a has a substantially cylindrical shape and is provided so as to extend upwards from a side wall of the processing container 12 to a position higher than the height of the upper electrode 30.

Further, in the plasma processing apparatus 10, a deposition shield 46 is detachably provided along the inner wall of the processing container 12. The deposition shield 46 is also provided on the outer circumference of the support unit 14. The deposition shield 46 is configured to prevent a byproduct of etching (deposition) from being attached to the processing container 12 and may be formed by covering an aluminum material with ceramics such as, for example, $Y_2O_3$.

In the bottom portion side of the processing container 12, an exhaust plate 48 is provided between the support unit 14 and the inner wall of the processing container 12. The exhaust plate 48 may be formed by covering an aluminum material with ceramics such as, for example, $Y_2O_3$. The processing container 12 is formed with an exhaust port 12e below the exhaust plate 48. An exhaust device 50 is connected to the exhaust port 12e via an exhaust pipe 52. Since the exhaust device 50 has a vacuum pump such as, for example, a turbo molecule pump, the inside of the processing container 12 may be depressurized to a desired degree of vacuum. The exhaust device 50 maintains the inside of the processing container 12 at the degree of vacuum of, for example, 20 mTorr to 40 mTorr (2.66 Pa to 5.32 Pa). The side wall of the processing container 12 is formed with a carry-in/out port 12g of a workpiece W and the carry-in/out port 12g is configured to be opened/closed by a gate valve 54.

A conductive member (GND block) 56 is provided on the inner wall of the processing container 12. The conductive member 56 is attached to the inner wall of the processing container 12 to be positioned at the height which is substantially the same as that of the workpiece W in the height direction of the conductive member 56. The conductive member 56 is connected to a ground in a DC-like manner so as to exhibit an abnormal electric discharge preventing effect. Meanwhile, the conductive member 56 may be installed in the plasma generating region and the installation position thereof is not limited to the position illustrated in FIG. 1. For example, the conductive member 56 may be provided at the base 16 side, for example, around the base 16. Also, the conductive member 56 may be provided in the vicinity of the upper electrode 30, for example, on the outer periphery of the upper electrode 30 in a ring shape.

In an exemplary embodiment, the plasma processing apparatus 10 is further provided with a power supply rod 58 configured to supply the high frequency power to the base 16 that constitutes the lower electrode. The power supply rod 58 constitutes a power supply line according to the exemplary embodiment. The power supply rod 58 has a coaxial double pipe structure and includes a rod-shaped conductive member 58a and a cylinder-shaped conductive member 58b. The rod-shaped conductive member 58a extends substantially vertically from the outside of the processing container 12 to the inside of the processing container 12 through the bottom portion of the processing container 12 and the upper end of the rod-shaped conductive member 58 is connected to the base 16. Also, the cylinder-shaped conductive member 58b is coaxial with the rod-shaped conductive member 58a such that it surrounds the rod-shaped conductive member 58a. The cylinder-shaped conductive member 58b is supported on the bottom portion of the processing container 12. Two pieces of substantially annular insulation members 58c are interposed between the rod-shaped conductive member 58a and the cylinder-shaped conductive member 58b to electrically insulate the rod-shaped conductive member 58a and the cylinder-shaped conductive member 58b.

Also, in an exemplary embodiment, the plasma processing apparatus 10 may be further provided with matching devices 70, 71. The matching devices 70, 71 are connected with the lower ends of the rod-shaped conductive member 58a and the cylinder-shaped conductive member 58b. Also, the matching devices 70, 71 are connected with a first high frequency power supply 62 and a second high frequency power supply 64, respectively. The first high frequency power supply 62 is configured to generate a first high frequency (RF: Radio Frequency) power with a frequency of 27 MHz to 100 MHz, for example, 40 MHz. The first high frequency power is 1000 W to 2000 W, for example. The second high frequency power supply 64 applies a high frequency bias to the base 16 to generate a second high frequency power for attracting ions to a workpiece W. The frequency of the second high frequency power is in the range of 400 kHz to 13.56 MHz, for example, 3 MHz. Also, the second high frequency power is 3000 W to 5000 W, for example. In addition, a direct current power supply 60 is connected to the upper electrode 30 via a low pass filter. The direct current power supply 60 outputs a minus direct current voltage to the upper electrode 30. By the configuration described above, two different high frequency powers may be supplied to the base 16 that constitutes the lower electrode, thereby applying a direct current voltage to the upper electrode 30.

In an exemplary embodiment, the plasma processing apparatus 10 may be further provided with a control unit Cnt. The control unit Cnt is a computer that includes, for example, a processor, a storage unit, an input device, and a display and controls each units of the plasma processing apparatus 10, for example, a power supply system, a gas supply system, and a drive system. In the control unit Cnt, an operator may, for example, perform an input operation of a command in order to manage the plasma processing apparatus 10 using the input device and the display may visualize and display an operation state of the plasma processing apparatus 10. Furthermore, the storage unit of the control unit Cnt is stored with a control program for controlling various processings which are executed in the plasma processing apparatus 10 by the processor or a program for executing a processing in each constitutional element of the plasma processing apparatus 10 according to a processing condition, that is, a processing recipe.

When etching is performed using the plasma processing apparatus 10, a workpiece W is mounted on the electrostatic chuck 18. The workpiece W may have a layer to be etched and a resist mask provided on the layer to be etched. Then, the processing gases from the gas supplies 40a to 40d are supplied into the processing container 12 at a predetermined flow rate while the inside of the processing container 12 is being exhausted by the exhaust device 50 and the inner pressure of the processing container 12 is set to be, for example, in the range of 0.1 Pa to 50 Pa.

Subsequently, the first high frequency power supply 62 supplies the first high frequency power to the lower electrode 16. Also, the high frequency power supply 64 supplied the second high frequency power to the lower electrode 16. Furthermore, the direct current power supply 60 supplies the first direct current voltage to the upper electrode 30. Accordingly, a high frequency electric field is formed between the upper electrode 30 and the lower electrode 16 to plasmarize the processing gases supplied to the processing space S. The layer to be etched of the workpiece W is etched by positive ions and radicals generated by the plasma.

Figure 2:
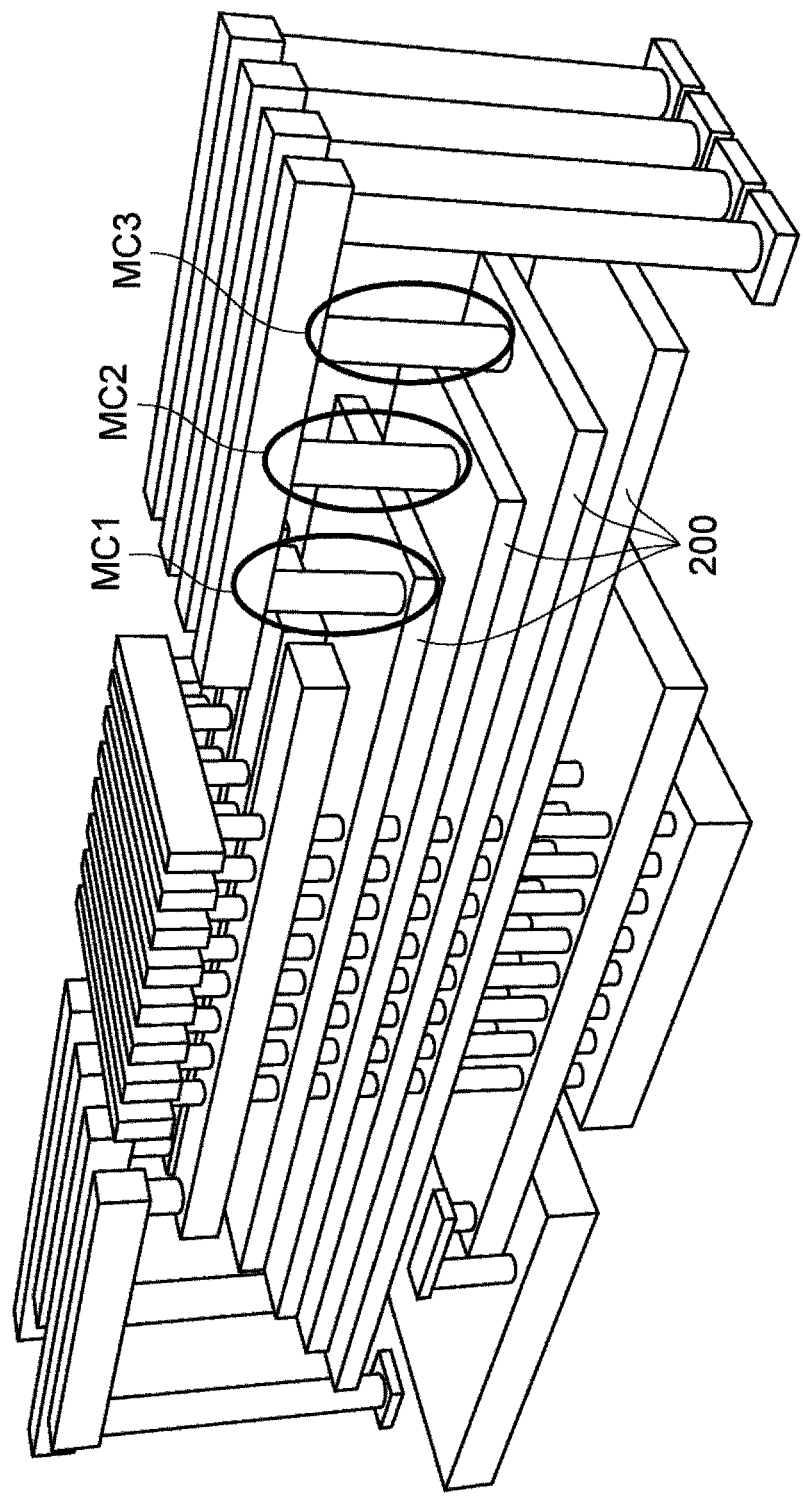
FIG. 2 is a schematic perspective view illustrating a NAND type flash memory having a three-dimensional structure.
Figure 3:
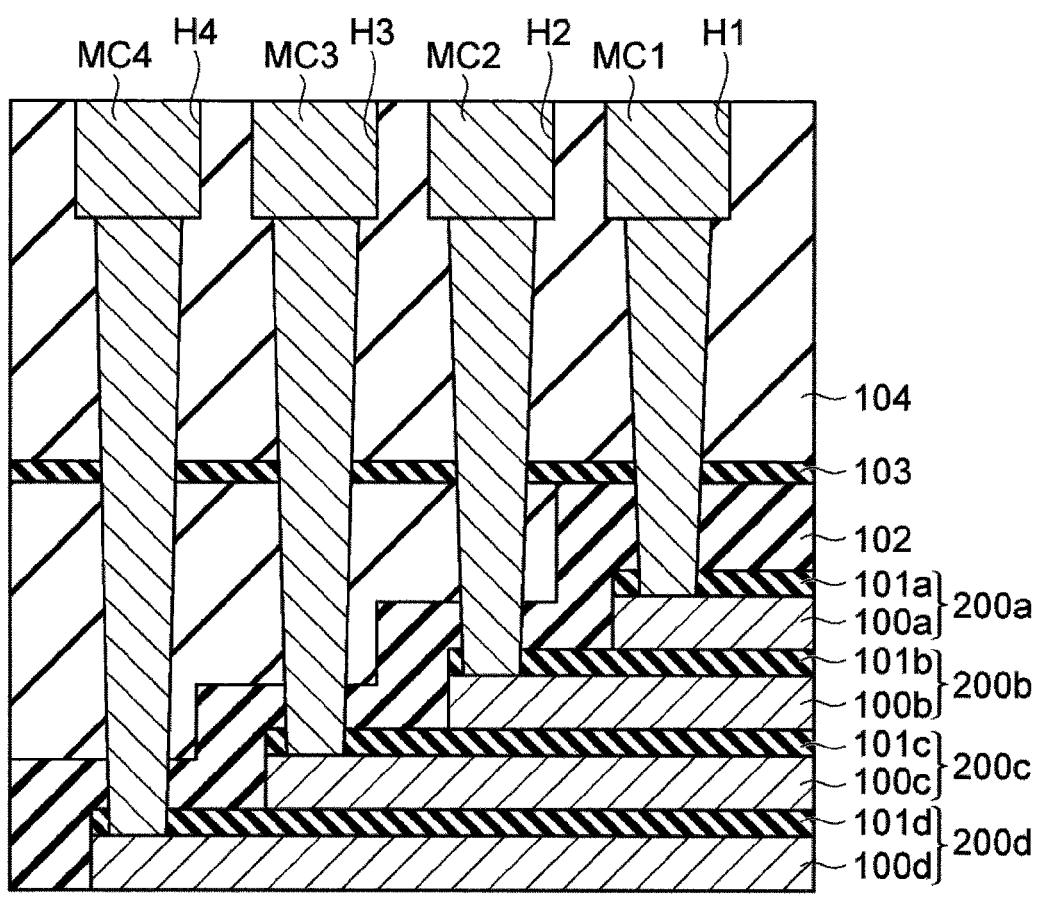
FIG. 3 is a cross-sectional view for describing metal contacts.

Next, a workpiece W which is etched by the plasma processing apparatus 10 will be described in detail. The workpiece W is used to form a structure of a NAND type flash memory having multilayered films of, for example, a three-dimensional structure. FIG. 2 is a schematic view illustrating the NAND type flash memory. As illustrated in FIG. 2, multi-layered wiring layers 200 have metal contacts MC1 to MC4 configured to supply potentials of word lines, respectively. In order to form the metal contacts, a plurality of end portions of the multi-layered wiring layers 200 are worked in a step shape. FIG. 3 is a schematic cross-sectional view illustrating a portion where the metal contacts MC1 to MC4 are formed. As illustrated in FIG. 3, of the multi-layered wiring layers 200a to 200d has, for example, an insulation layer 101a, 101b, 101c, or 101d and a conductive film 100a, 100b, 100c, or 100d. The lengths of the multi-layered wiring layers 200 are set in such a manner that the lowermost wiring layer 200d has the longest length and the uppermost wiring layer 200a has the shortest length. The lengths of the multi-layered wiring layers 200a to 200d get shorter from the lowermost wiring layer 200d towards the uppermost wiring layer 200a. An insulation layer 102, a buffer film 103, and an amorphous carbon layer ("ACL") 104 are formed on the top of each of the multi-layered wiring layers 200a to 200d. The metal contacts MC1 to MC4 are formed by depositing a conductive material such as, for example, a metal, into holes H1 to H4 formed on the ACL 104, the buffer film 103, and the insulation layer 102. The holes H1 to H4 are simultaneously formed when the insulation layer 102 and the buffer film 103 are etched using the conductive films 100a to 100d as base layers (etching stop layers) and the depths thereof are different from one another.

Figure 4A:
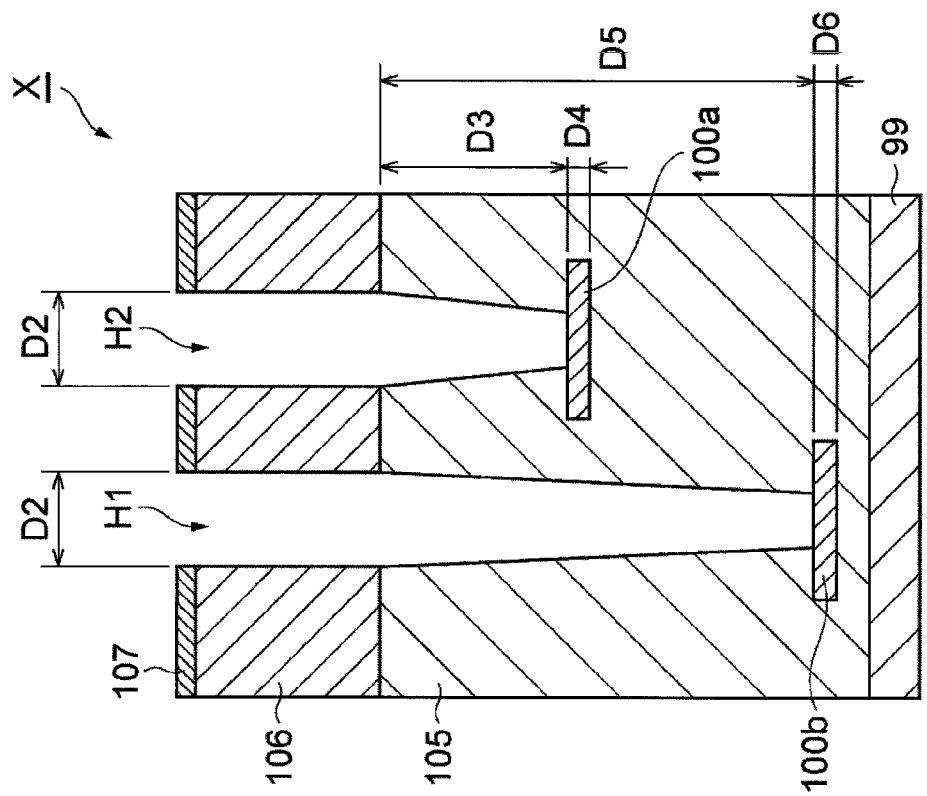
FIGS. 4A and 4B are schematic views for describing an etching process.
Figure 4B:
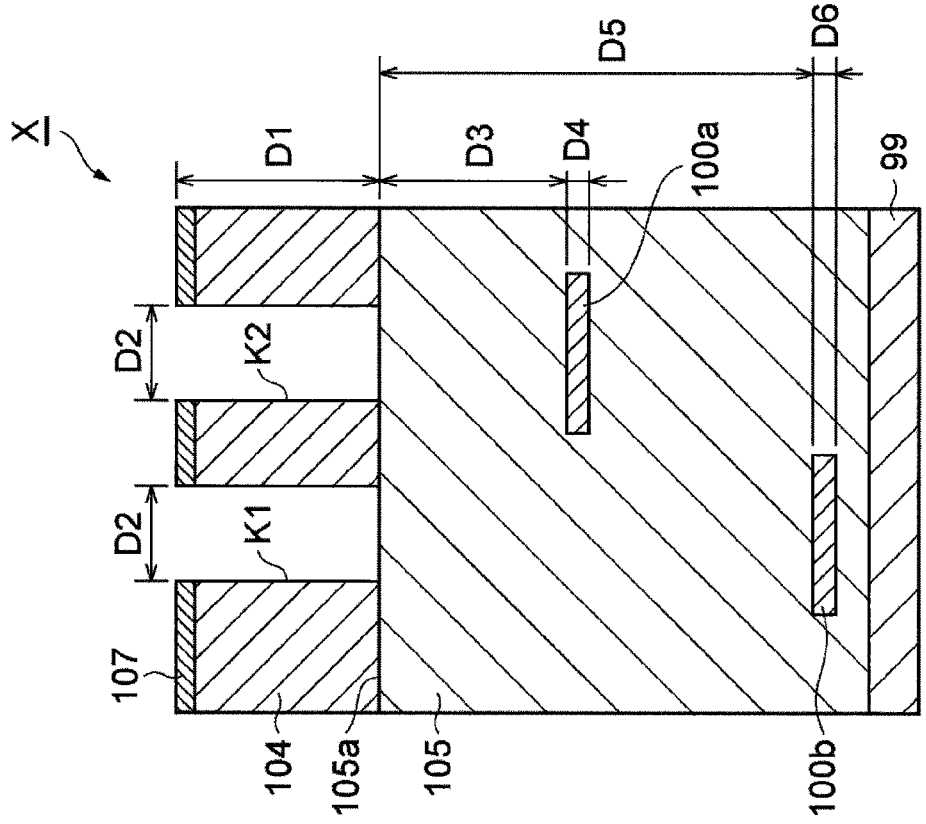

The etching process that simultaneously forms the holes having different depths described above will be described using a schematic view where the structure is simplified. FIGS. 4A and 4B are schematic views for describing the etching process of the plasma processing method. As illustrated in FIG. 4A, a workpiece W has a substrate 99, an insulation layer (oxide layer) 105, an ACL 104, and a hard mask 107 such as, for example, SiNO. The insulation layer 105 is formed on the substrate 99 using, for example, $SiO_2$. The etching stop layers (conductive films) 100a, 100b are disposed at different positions in the laminating direction inside the insulation layer 105. For example, the etching stop layer 100a is positioned at depth D3 from a top surface 105a of the insulation layer 105 and the etching stop layer 100b is positioned at depth D5 from the top surface 105a of the insulation layer 105. That is, the etching stop layers 100a, 100b are disposed below the top surface 105a of the insulation layer 105 in the laminating direction. For example, depth D3 is about 1000 nm to 1500 nm and depth D5 is about 3000 nm to 3500 nm. That is, the plurality of simultaneously formed holes may have different depths and the depth of a hole may be two or more times as deep as that of another hole. For example, tungsten (W) is used as the etching stop layers and the thicknesses of the etching stop layers are, for example, about 30 nm to 80 nm.

The ACL 104 and the hard mask 107 are disposed as a mask layer above the top surface 105a of the insulation layer 105 in the laminating direction. The ACL 104 and the hard mask 107 have openings K1, K2 of diameter D2 formed at the positions which overlap the plural etching stop layers 100a, 100b when viewed in the laminating direction, respectively. Here, the height of the mask layer is, for example, 1000 nm to 1500 nm and the diameters of the openings K1, K2 are 50 nm to 100 nm.

Subsequently, as illustrated in FIG. 4B, the mask layer and the etching stop layers 100a, 100b are used to simultaneously etch plural holes H1, H2 having different depths in the insulation layer 105. Here, as for the processing gas for etching the insulation layer 105, a processing gas that includes a fluorocarbon-based gas, a rare gas, oxygen, and nitrogen is employed. In an exemplary embodiment, when the flow rate of oxygen is set as X (X>0) and the flow rate of nitrogen is set as Y (Y>0), X and Y may satisfy Y=−5X+b (300 sccm<b<375 sccm). Also, in an exemplary embodiment, the numerical value b may satisfy 325 sccm≤b≤350 sccm and the flow rate of oxygen and the flow rate of nitrogen may be adjusted such that the flow rate of nitrogen Y is 50 sccm≤Y≤100 sccm.

The fluorocarbon-based gas contributes to etching an oxide layer and CF, $CF_2$, and $CF_3$ radicals are generated from the fluorocarbon-based gas. Here, when nitrogen is added, the CF radicals and the $CF_3$ radicals are reduced among CF, $CF_2$, and $CF_3$ radicals generated from the fluorocarbon-based gas. The CF radicals are precursors of reaction products attached to the openings of the holes. When the CF radicals are reduced, clogging (blockage of the openings of the holes) is suppressed, necking of the holes is improved, and bowing is improved. As a result, the holes H1, H2 having excellent shapes may be formed. When nitrogen is added, reaction products attached to the openings of the holes are reduced. Therefore, the flow rate of oxygen for removing the reaction products may be reduced. By reducing the flow rate of oxygen, excessive etching of the protective films formed on the etching stop layers 100a, 100b is avoided. Thus, the etching stop layers 100a, 100b may withstand etching for a long time. As described above, the flow rate of oxygen and the flow rate of nitrogen are set in such a manner that the etching of the etching stop layer 100a except the etching stop layer 100b which is the bottom of the deepest hole H2 from the top surface 105a of the insulation layer 105 to the surface of the etching stop layer 100b which is the bottom of the deepest hole H2 is suppressed and the clogging of the openings of the plural holes H1, H2 is also suppressed until the etching is performed from the top surface 105a of the insulation layer 105 to the surface of the etching stop layer 100b which is the bottom of the deepest hole H2. Therefore, when the protective films are formed on the surfaces of the etching stop layers 100a, 100b, a high selection ratio of the etching stop layers 100a, 100b, and the insulation layer 105 may be realized and the holes H1, H2 having the excellent shapes may be formed while suppressing the clogging of the holes H1, H2.

Meanwhile, actions resulted from introducing nitrogen are not limited to the foregoing and actions set forth below may occur in combination.

For example, $CF_2$ radicals form the protective film of tungsten at the bottom of the hole. Even when nitrogen is added, the $CF_2$ radicals tend not to be reduced as compared with the CF and $CF_3$ radicals. Thus, when nitrogen is added, the CF radicals are reduced, the attachment of deposition to the openings of the holes is reduced, necking is improved, and $CF_2$ radicals reach the bottoms of the holes easily. As a result, it is thought that a good protective film is formed on each of the surfaces of tungsten layers which are the etching stop layers. Or, it is also thought that a CN-based protective film having higher etching resistance than that of a CF-based protective film is formed on the surfaces of tungsten surfaces which are the etching stop layers.

The first ionization energies of O, N, $O_2$, and $N_2$ are 13.618 eV, 14.53 eV, 12.07 eV, and 15.58 eV, respectively. Thus, O is easily ionized as compared to N and O ions may be easily drawn into the bottoms of holes. Therefore, when a large amount of O exists, it is thought that the protective films of the surfaces of the tungsten layers which are the etching stop layer tend to be easily etched. Meanwhile, it is thought that since N is hardly ionized as compared to O, the ratio of N acting as radicals increases and N participates in the removal of deposition of the openings of the holes rather than the bottoms of the holes. Also, N radicals have a higher attachment coefficient as compared to O radicals. Thus, it is thought that the N radicals hardly reach the bottom of the holes since they react with the deposition of the openings of the holes. Therefore, it is thought that a good hole shape and a high selection ratio may be realized when nitrogen is introduced and the ratio of oxygen is reduced.

Although various exemplary embodiments have been described above, the present disclosure is not limited thereto and may constitute various modified aspects. For example, in the exemplary embodiments as described above, two high frequency power supplies are connected to the lower electrode 16. However, the first high frequency power supply may be connected to one of the lower electrode 16 and the upper electrode 30 and the second high frequency power supply may be connected to the other electrode.

EXAMPLES

Hereinafter, examples and comparative examples carried out by the present inventor will be described.

Examples 1 to 7

A $SiO_2$ layer which is an insulation layer was formed on a tungsten layer which is an etching stop layer, a mask constituted with a hard mask layer and an ACL was formed, and a hole was formed by etching under the following conditions.

[Etching Conditions]
Flow Rate of Gas
$C_4F_6$ gas: 50 sccm
Ar gas: 600 sccm
$O_2$ gas: 45 sccm to 60 sccm
$N_2$ gas: 50 sccm to 100 sccm
Processing time: 380 sec Here, the flow rates of $O_2$ gas and $N_2$ gas were 60 sccm and 50 sccm, respectively, in Example 1, 55 sccm and 50 sccm in Example 2, 50 sccm and 50 sccm in Example 3, 60 sccm and 100 sccm in Example 4, 55 sccm and 100 sccm in Example 5, 50 sccm and 100 sccm in Example 6, and 45 sccm and 100 sccm in Example 7.

Comparative Examples 1 and 2

In Comparative Examples 1 and 2, etching was performed using a processing gas which does not include nitrogen. The flow rate of $O_2$ gas as an etching condition was 65 sccm in Comparative Example 1 and 60 sccm in Comparative Example 2. Other conditions were the same as those of Examples 1 to 7.

(Other Processes)

In Comparative Example 1, 2 and Examples 1 to 7, an ashing process for the insulation layer and an ashing process for the etching stop layer were performed.

(Results)

Figure 8:
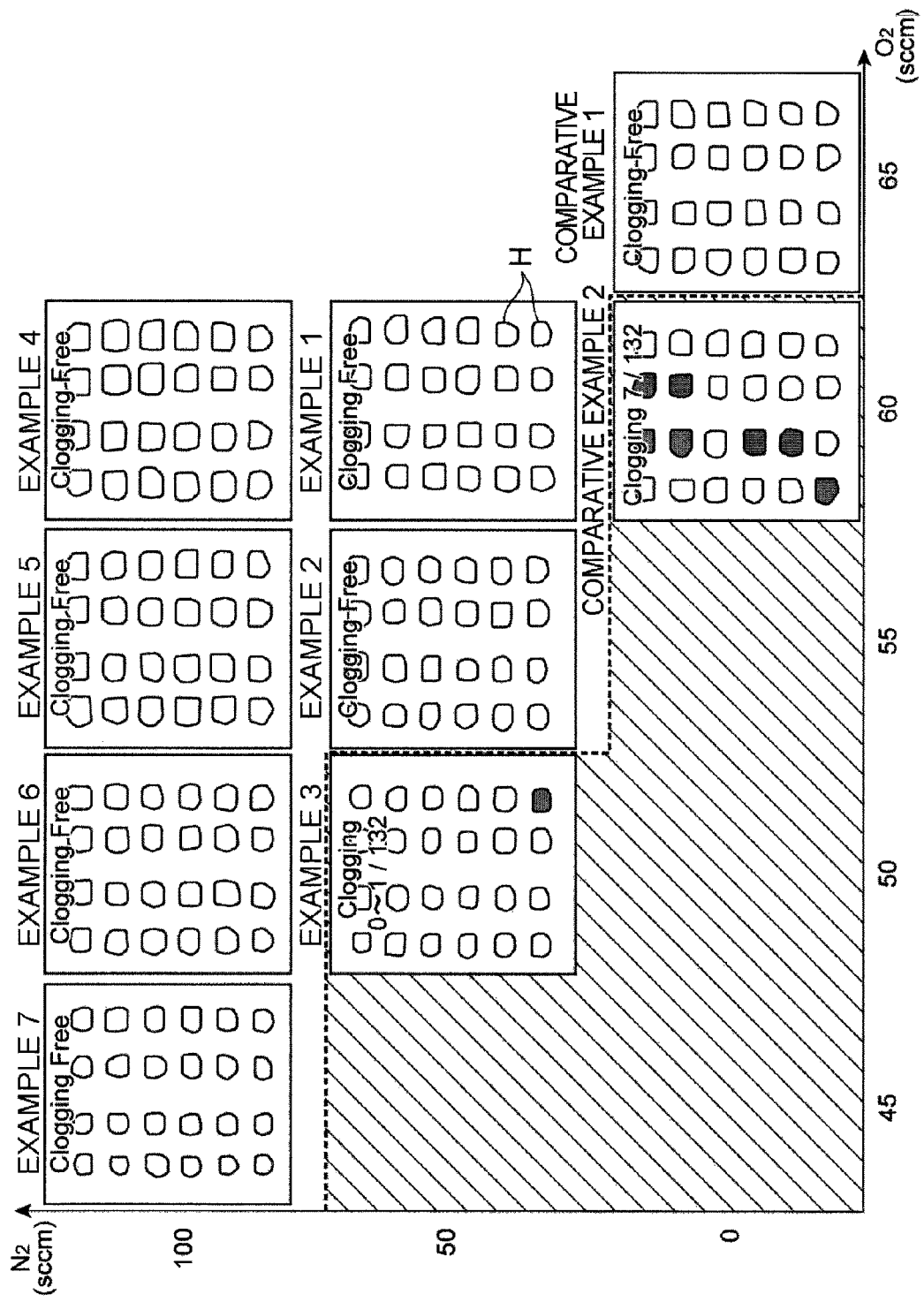
FIG. 8 is a graph representing evaluation results of clogging in Examples and Comparative Examples as a relationship between oxygen and nitrogen.

FIG. 5 is a table representing the results of evaluating a hole shape, etching resistance of etching stop layers, and clogging in Examples 1 to 7 and Comparative Examples 1 and 2 are evaluated. In FIG. 5, Comparative Examples 1 and 2 and Examples 1 to 7 are indicates as numbers. Target refers to a target value (reference value). The values were determined from SEM images. Details of the results represented in FIG. 5 are illustrated in FIGS. 6 to 8.

(Evaluation of Hole Shape)

Firstly, the hole shape was evaluated based on whether the ACL which is a mask of an insulation layer was etched or not, the thickness of the ACL after etching, and the selection ratio of the $SiO_2$ layer and the ACL. As illustrated in FIG. 5, it was confirmed that although the ACL was somewhat etched in Examples 4 and 5, the ACL with the thickness of, for example, 254 nm or 351 nm remained and enough film thickness as a mask remained. Also, it was confirmed that the target depth of the hole depth of 3000 nm to 3200 nm was achieved in Comparative Example 1 and Examples 1, 2, 4, 5 and 6. Subsequently, after the ashing process for the insulation layer, a width in the vicinity of the opening of the hole Top, the maximum width of the hole Bow, and a difference Δ(Bow.-Top) were measured. As illustrated in FIG. 5, it was confirmed that the difference Δ(Bow-Top) in Comparative Example 1 was 51 and the hole shape was not good. Meanwhile, the difference Δ(Bow-Top) in Examples 1, 2, 4, 5 and 6 was in the range of 6 to 32. Therefore, it was confirmed that the hole shapes becomes good as an effect of adding nitrogen. Subsequently, the ashing process for the etching stop layer was performed and a width in the vicinity of the opening of the hole Top, a width of the bottom Btm, and the maximum width of the hole Bow were measured. The results were represented in FIGS. 6A to 6E. FIGS. 6A to 6E are views schematically illustrating the images of cross-sectional SEM images of Comparative Example 1 and Examples 1 and 4 to 5. As illustrated in FIGS. 6A to 6E, the width in the vicinity of the opening of the hole Top, the width of the bottom Btm, and the maximum width of the hole Bow were measured. As apparent from Top values and Bow values represented in FIGS. 6A to 6E, it was confirmed that the difference Δ(Bow-Top) is smaller in Examples 1, 4, 5 and 6 as compared to Comparative Example 1. Therefore, it was reconfirmed that the hole shape becomes good as an effect of adding nitrogen.

(Evaluation of Etching Resistance of Etching Stop Layer)

After the ashing process for the etching stop layer, a loss of a tungsten layer which is an etching stop layer (the etched depth from the stop surface of the tungsten layer) and a selection ratio ($SiO_2$/W) were evaluated. As illustrated in FIG. 5, it was confirmed that the loss of the tungsten layer was reduced in Examples 1, 2, 4, 5 and 6 as compared to Comparative Example 1 and the selection ratio was large in Examples 1, 2, 4, 5, 6 as compared to Comparative Example 1. FIG. 7 is a graph illustrating schematic views of the cross-section SEM images in Comparative Example 1 and Examples 1, 2, 4, 5 and 6 after the values of FIG. 5 were confirmed and a relationship of the flow rate of oxygen and the flow rate of nitrogen. The horizontal axis is the flow rate of oxygen and the vertical axis is the flow rate of nitrogen. As illustrated in FIG. 7, it was confirmed that the loss of the tungsten layer is reduced as the amount of oxygen decreases.

(Evaluation of Clogging)

It was visually confirmed whether clogged holes exist or not among 132 holes of the photographed SEM images before the ashing process. The results are illustrated in FIG. 5. Meanwhile, when no clogged hole exists, the result is indicated as Free. As illustrated in FIG. 5, clogging was confirmed in Comparative Example 2 and Example 3. No clogged holes existed in Comparative Example 1 and Examples 1, 2, 4, 5, 6 and 7. FIG. 8 is a graph illustrating schematic views of Comparative Examples 1 and 2 and Examples 1 to 7 and the relationship of the flow rate of oxygen and the flow rate of nitrogen. The horizontal axis is the flow rate of oxygen and the vertical axis is the flow rate of nitrogen. In the schematic views, holes H viewed from the top side are depicted and the portions indicated by substantially circular shapes are portions opened as the holes H. Gray holes are holes where clogging occurred. As illustrated in FIG. 8, it was confirmed that clogging is improved as the amount of nitrogen and the amount of oxygen increase.

(Relationship of Flow Rate of Oxygen and Flow Rate of Nitrogen)

Figure 9:
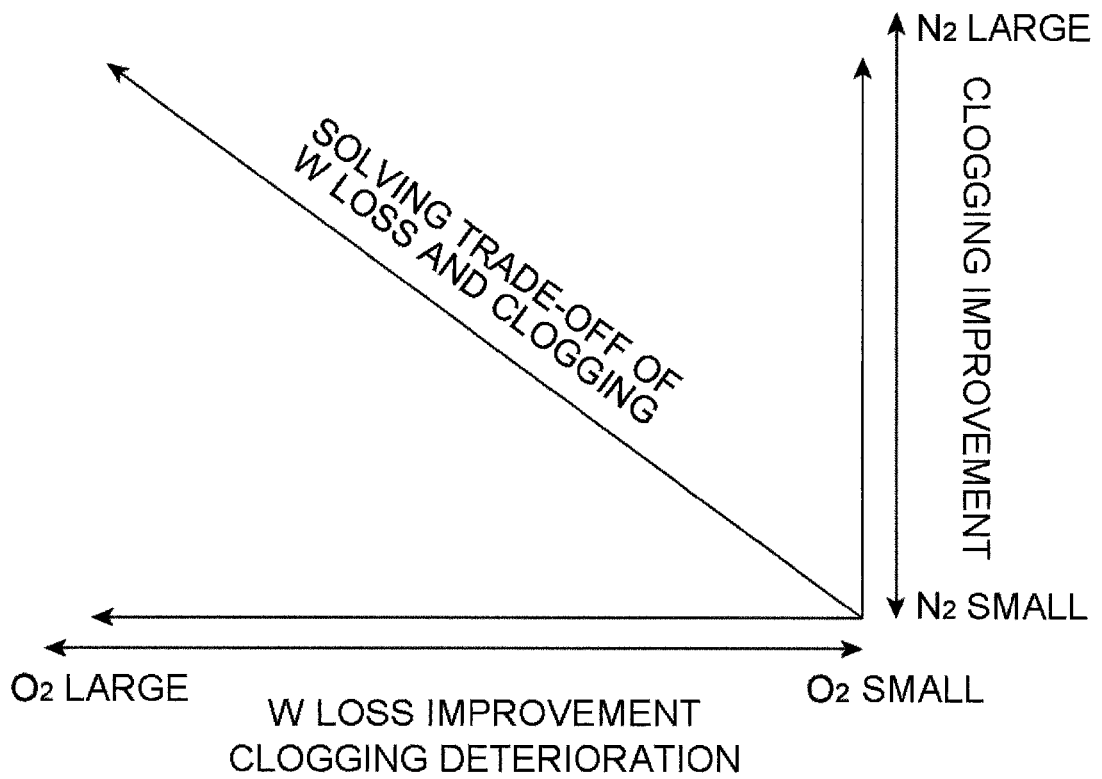
FIG. 9 is a graph representing a relationship between a flow rate ratio of nitrogen and a flow rate ratio of oxygen.
Figure 10:
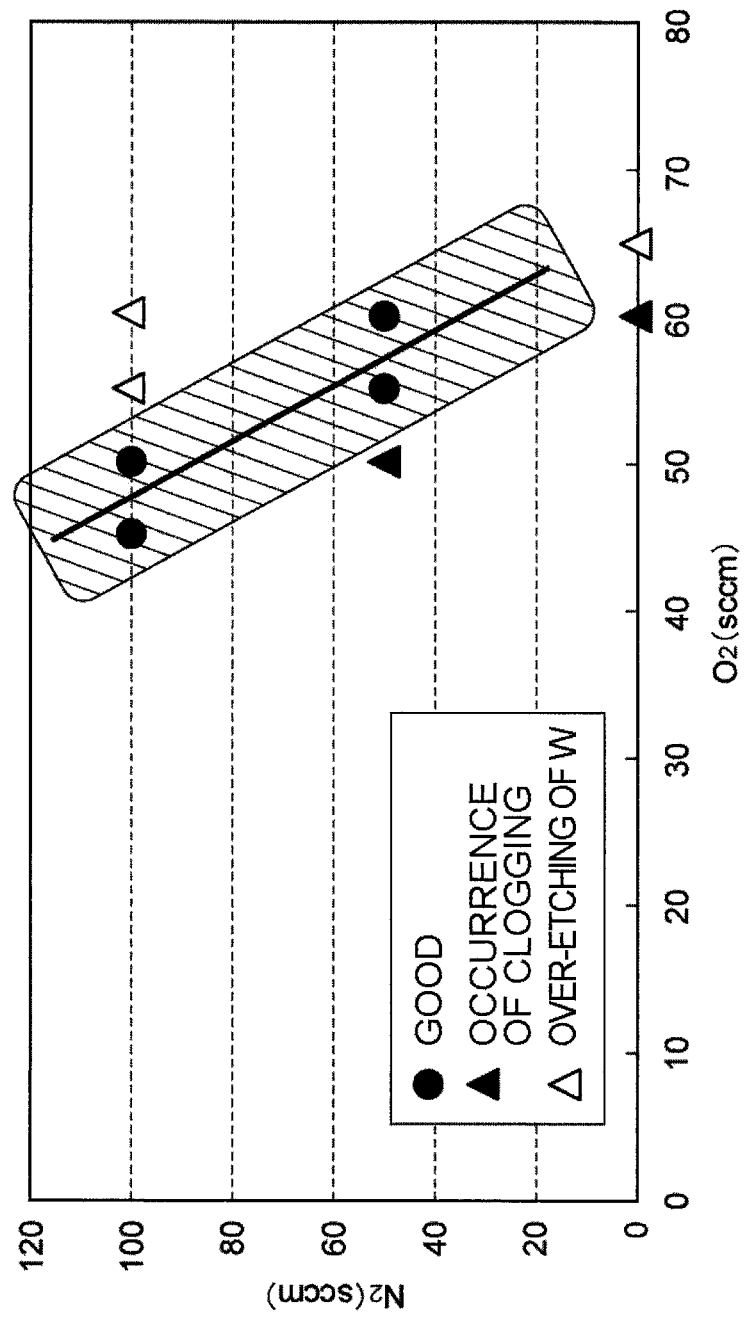
FIG. 10 is a graph representing optimum flow rates of nitrogen and oxygen.

FIG. 9 is a graph illustrating a tendency obtained from experimental results illustrated in FIGS. 5 to 8 and the horizontal axis is the flow rate of oxygen and the vertical axis is the flow rate of nitrogen. As illustrated in FIG. 9, it can be seen that clogging is improved when the flow rate of nitrogen is increased. Also, it can be seen that the loss of the tungsten layer is improved while clogging deteriorates when the amount of oxygen decreases. Thus, it can be seen that there is a relationship of oxygen and nitrogen for solving trade-off between the loss of the tungsten layer and clogging. FIG. 10 illustrated the examined relationship in detail. FIG. 10 is a graph representing a tendency obtained from the test results illustrated in FIGS. 5 to 8 in detail and the horizontal axis is the flow rate of oxygen and the vertical axis is the flow rate of nitrogen. The black circles in FIG. 10 represent a condition in which both the loss of the tungsten layer and clogging were improved, the black triangles represent a condition in which clogging occurred, and the white triangles represent a condition in which the loss of tungsten layer occurred. That is, in the shaded region in the figure, the flow rate of oxygen and the flow rate of nitrogen solve the trade-off between the loss of the tungsten layer and clogging. This region may be defined based on the distance from the solid line depicted in the figure. From the test results, when the flow rate of oxygen was set as X (X>0) and the flow rate of nitrogen was set as Y (Y>0), X and Y satisfied Y=−5X+b (300 sccm<b<375 sccm).

Also, it was found out that the numerical value b may satisfy 325 sccm≤b≤350 sccm and the flow rate of nitrogen may be 50 sccm≤Y≤100 sccm. As described above, a relationship of the flow rate of oxygen and the flow rate of nitrogen which is capable of forming the protective film on the surface of an etching stop layer and suppressing the clogging of the openings of holes was specified.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing method comprising:
   providing a plasma processing apparatus that includes a processing container which defines a processing space and a gas supply unit configured to supply a processing gas into the processing space;
   supplying the processing gas including a fluorocarbon-based gas, a rare gas, an oxygen gas, and a nitrogen gas into the processing container to generate plasma; and
   etching multi-layered films which include an oxide layer and a plurality of etching stop layers, the etching stop layers being made of tungsten and disposed below a top surface of the oxide layer in a laminating direction as well as at different positions in the laminating direction, from the top surface of the oxide layer to the plurality of etching stop layers so as to simultaneously form a plurality of holes having different depths in the oxide layer,
   wherein each of a flow rate of the oxygen gas and a flow rate of the nitrogen gas is controlled to satisfy a condition of Y=−5X+b where X is the flow rate of the oxygen gas, Y is the flow rate of the nitrogen gas, and b is a flow rate between 300 sccm and 375 sccm.

2. The plasma processing method of claim 1, wherein flow rates of the oxygen and the nitrogen are set in such a manner that the plurality of etching stop layers except the etching stop layer which is a bottom of the deepest hole are suppressed from being etched and openings of the plurality of holes are also suppressed from being clogged until the etching is performed from the top surface of the oxide layer to the surface of the etching stop layer which forms the bottom of the deepest hole.

3. The plasma processing method of claim 1, wherein the numerical value b satisfies 325 sccm≤b≤350 sccm and the flow rate of the nitrogen Y is 50 sccm≤Y≤100 sccm.

4. The plasma processing method of claim 1, wherein in the multi-layered films, the plurality of etching stop layers are disposed such that the depth of the deepest hole is twice or more than the depth of the shallowest hole.

5. The method of claim 1, wherein the rare gas is an Ar gas.

* * * * *